(12) United States Patent
Liou

(10) Patent No.: US 6,946,343 B2
(45) Date of Patent: Sep. 20, 2005

US006946343B2

(54) MANUFACTURING METHOD OF AN INTEGRATED CHIP

(75) Inventor: Fu-Tai Liou, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 54 days.

(21) Appl. No.: 10/249,374

(22) Filed: Apr. 3, 2003

(65) Prior Publication Data

US 2004/0197985 A1 Oct. 7, 2004

(51) Int. Cl.⁷ ............... H01L 21/8242; H01L 21/336
(52) U.S. Cl. ............... 438/241; 438/258; 438/800; 700/109
(58) Field of Search ............... 438/241, 258, 438/800; 700/109

(56) References Cited

U.S. PATENT DOCUMENTS

| | | | |
|---|---|---|---|
| 6,420,227 B1 * | 7/2002 | Yoshida et al. | 438/241 |
| 6,509,235 B2 | 1/2003 | Chien et al. | |
| 6,559,059 B2 | 5/2003 | Chien et al. | |
| 2002/0082738 A1 * | 6/2002 | Goldman et al. | 700/109 |
| 2003/0063555 A1 * | 4/2003 | Yamazaki | 370/200 |
| 2003/0069658 A1 * | 4/2003 | Yamazaki | 700/97 |

FOREIGN PATENT DOCUMENTS

| | | | |
|---|---|---|---|
| DE | 19737839 A1 * | 3/1999 | B65G/37/00 |
| TW | 490852 | 6/2002 | |
| TW | 522565 | 3/2003 | |

* cited by examiner

*Primary Examiner*—John F. Niebling
*Assistant Examiner*—Jennifer M. Kennedy
(74) *Attorney, Agent, or Firm*—Winston Hsu

(57) ABSTRACT

A manufacturing method of an integrated chip. The integrated chip includes at least two devices with different functions. The method uses a first production line to form a first device on a semiconductor wafer and then uses a second production line to form a second device on the semiconductor wafer so as to complete the integrated chip.

5 Claims, 1 Drawing Sheet

MANUFACTURING METHOD OF AN INTEGRATED CHIP

BACKGROUND OF INVENTION

1. Field of the Invention

The present invention relates to a manufacturing method of an integrated chip, and more particularly, to a manufacturing method of an integrated chip including devices with different functions.

2. Description of the Prior Art

According to the current semiconductor industry, a single production line, usually a standard foundry, is used to fabricate integrated circuits into chips, and then a semiconductor wafer including the integrated chips is outsourced to other manufactures respectively specialized in the operations of test and packaging. Generally speaking, the integrated chip, such as a microprocessor unit or an application specific integrated circuit (ASIC), includes a variety of devices, such as logic circuits, volatile memories, non-volatile memories, mixed-mode circuits, etc., interconnected by peripheral circuits to form a complete circuit for a specific function. Each of the above-mentioned devices has different structural characteristics and requires different processes for fabrication. Consequently, the prior art method of fabricating the devices by a single production line suffers many problems.

Taking an embedded memory for an example, an embedded memory includes memory cell arrays and high-speed logic circuit devices integrated and formed onto a single chip for significantly reducing the circuit area and raising the signal processing speed. FIG. 1 is a structural diagram of an embedded memory 10. As shown in FIG. 1, the embedded memory 10 comprises a memory array area 12 and a peripheral circuit region 14 defined on a surface of a silicon substrate 16 of a semiconductor wafer (not shown in FIG. 1). The memory array area 12 comprises a cell well 18, and a plurality of gates 20 are formed on the cell well 18 for constructing a MOS transistor. The periphery circuit region 14 comprises at least an N-well 22 and a P-well 24, and a plurality of gates 20 are formed on the N-well 22 and the P-well 24 for respectively constructing a PMOS transistor and an NMOS transistor. A spacer 28 is formed around each gate 20, 26, and an LDD 30, a source 32 and a drain 34 are formed on either side of each gate 20, 26 on the surface of the silicon substrate 16.

According to the embedded memory 10, the memory cell arrays in the memory array area 12 and the logic circuit devices in the peripheral circuit region 14 respectively have specific functions. Therefore, the prior art method of manufacturing the embedded memory 10 cannot conform to the requirements of both the memory cell array and logic circuit device. For example, the logic circuit devices in the periphery circuit region 14 need to have low resistance and high speed, and a self-alignment silicide (salicide) process is performed to form a silicide layer on the gate 26, source 32 and drain 34 of the MOS transistor for reducing interface resistance. However, a self-aligned-contact (SAC) process developed for solving the electrical connection problem of memory cells formed in the memory array area 12 involves forming a cap layer composed of silicon nitride on a top surface of the gate 20 of the MOS transistor and used as an isolation mask in the subsequent SAC process. The problem is the inability to simultaneously perform both of the above processes, so that the prior art method of manufacturing the embedded memory 10 provides two ways for solving this problem. One is based on the salicide process of the peripheral circuit region 14 and therefore forms a silicide layer. The other is based on the SAC process of the memory array area 12 and therefore does not form a silicide layer. However, the former way increases junction leakage current and further adversely affects storage charge refresh times, and the latter way increases surface resistance of the gate 26, source 32 and drain 24 of the MOS transistor in the periphery circuit region 14, which results in decreasing access speed.

Additionally, the depth of the gate 26 of the PMOS transistor in the peripheral circuit region 14 generally is kept at 2000~3000 Å for preventing boron penetration issues. For combining the fabrication of the gates 20, 26 in the peripheral circuit region 14 and in the memory array area 12, according to the prior art method of manufacturing the embedded memory 10, the depth of the gate 20 in the memory array area 12 will increase to fit in with the depth of the gate 26 in the periphery circuit region 14. As the integration of the memory array area 12 increases, the aspect ratio between gates 20 greatly increases. Thus, over-hanging easily occurs between two neighboring gates in the memory array area 12 when filling an inter-layer dielectric (ILD) layer. A void bridge may then be formed, creating an electrical connection with a contact plug formed between two neighboring gates, and leading to short-circuiting.

The prior art method of manufacturing the embedded memory 10 by a single production line suffers the problem of defective products due to the difficulties in combining the processes of the logic circuit devices and the memory cell arrays. Additionally, either hardware (such as equipment) or software (such as training of staff) of the standard foundry is not established for fabricating memory cells, therefore, the standard foundry must experience a manufacturing learning curve when fabricating the embedded memory, resulting in a reduced yield and output.

SUMMARY OF INVENTION

It is a primary objective of the claimed invention to provide a manufacturing method of an integrated chip for solving the above-mentioned problems.

According to the claimed invention, a manufacturing method of an integrated chip is provided. The integrated chip includes at least two devices with different functions. The method uses a first production line to form a first device on a semiconductor wafer and then uses a second production line to form a second device on the semiconductor wafer so as to complete the integrated chip.

The claimed method of manufacturing an integrated chip uses different production lines, such as specialized factories, to fabricate differentdevices included in the integrated chip. Consequently, the claimed method prevents the characteristics of each device form being omitted during combined fabricating processes performed by a single production line, and the claimed method further increases production yield and reduces cost.

These and other objectives of the present invention will no doubt become obvious to those of ordinary skill in the art after reading the following detailed description of the preferred embodiment, which is illustrated in the following drawing.

DETAILED DESCRIPTION

Figure 1:
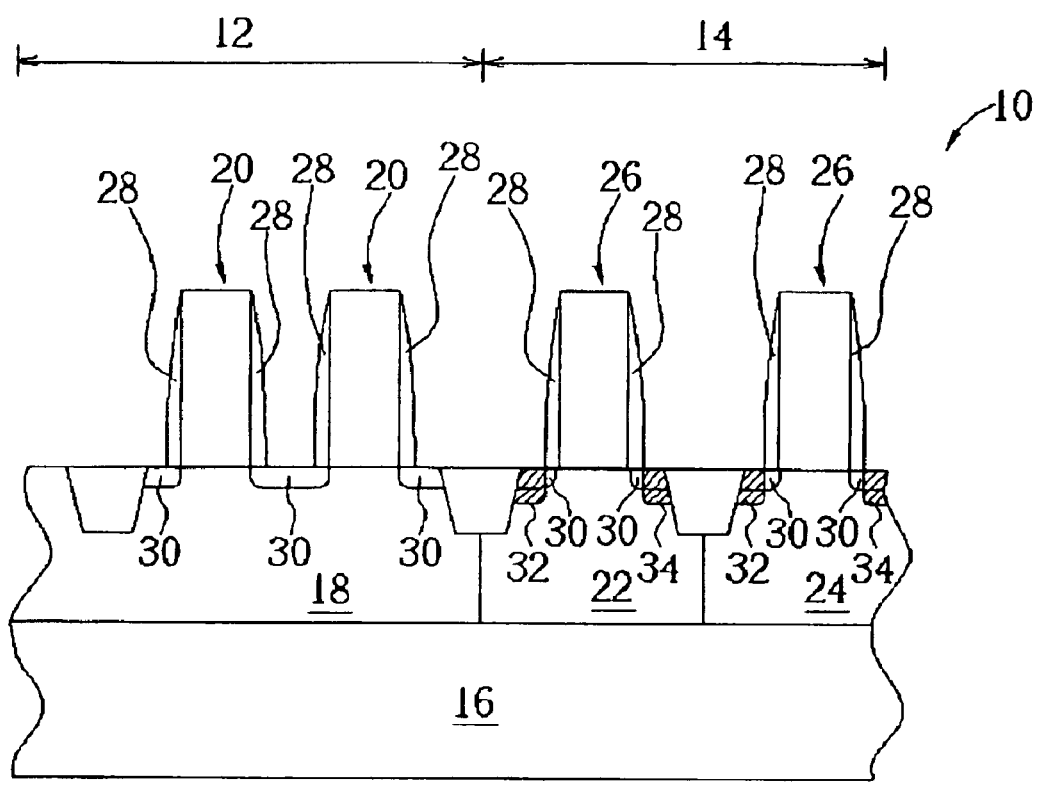
FIG. 1 is a structural diagram of an embedded memory.

The present invention provides a manufacturing method of an integrated chip including at least two devices with different functions. The method first forms a first device on a semiconductor wafer by a first production line and then forms a second device on the semiconductor wafer by a second production line so as to complete the integrated chip. During the manufacturing processes, photo masks are used to faithfully transfer layout patterns to the surface of the semiconductor wafer. Therefore, for preventing the disagreements of the layout patterns caused by mask tolerance variations and different process parameters between different production lines, the photo masks used by the first production line and the photo masks used by the second production line collectively form an integral set of photo masks for manufacturing the integrated chip.

Taking an embedded memory for an example, according to a preferred embodiment of the present invention, memory cell arrays of the embedded memory are first formed on a semiconductor wafer by a memory factory, and then the semiconductor wafer is moved to a standard foundry for forming logic circuit transistors and metal lines. Finally, the embedded memory including memory cell arrays and logic circuits is outsourced to other manufactures respectively specialized in the operations of test and packaging.

The yield of the embedded memory is calculated by multiplying the yield of the memory cell arrays by the yield of the logic circuit devices. According to the present invention method, the memory cell arrays and the logic circuit devices are respectively formed by the memory factory and the standard foundry, and both of the individual yields of the memory cell arrays and the logic circuit devices are above 90%. Consequently, the yield of embedded memory is more than 80%. Comparatively, according to the prior art method of manufacturing the embedded memory by a single production line, the training and equipment of the memory factory do not conform to the requirements of the logic circuit devices, and also the standard foundry cannot fully realize the specific processes of the memory cell arrays. Therefore, neither the memory factory nor the standard foundry simultaneously performs a high yield of the memory cell arrays and the logic circuit devices. Furthermore, the yield of the embedded memory is significantly decreased.

Additionally, in the semiconductor industry, cost is reduced with an increased output. According to the present invention method, the memory factory and the standard foundry respectively fabricate the memory cell arrays and the logic circuit devices with maximum output. Therefore, the cost of the embedded memory is reduced. Comparatively, according to the prior art method of manufacturing the embedded memory by a single production line, both of the memory factory and the standard foundry cannot perform maximum output due to the difficulties in obtaining know-how technique, which causes the cost of the embedded memory to increase.

The present invention method is not limited to the embedded memory, and any integrated chip comprising devices with different functions is suitable for the present invention method. In a word, the present method of manufacturing an integrated chip uses different production lines, such as specialized factories, to fabricate differentdevices included in the integrated chip. Consequently, the present method prevents the characteristics of each device form being omitted during a combined fabricating process performed by a single production line, and the present method further increases production yield and reduces cost.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A manufacturing method of an integrated chip including at least two devices with different functions, the method comprising:

forming a memory cell array on a semiconductor wafer by a memory factory; and forming a logic circuit on the semiconductor wafer by a standard foundry so as to complete the integrated chip.

2. The method of claim 1 wherein the integrated chip is an embedded memory.

3. The method of claim 1 wherein the logic circuit comprises transistors of the logic circuit and metal lines.

4. The method of claim 1 wherein each of the memory factory and the standard foundry uses at least one photo mask to perform a photolithography process.

5. The method of claim 4 wherein the photo mask of the memory factory and the photo mask of the standard foundry collectively form an integral set of photo masks for manufacturing the integrated chip.

* * * * *